United States Patent
Iida et al.

(10) Patent No.: US 11,549,807 B2
(45) Date of Patent: Jan. 10, 2023

(54) SUBSTRATE AND METHOD FOR CALIBRATION OF MEASUREMENT APPARATUS

(71) Applicant: Kioxia Corporation, Tokyo (JP)

(72) Inventors: Susumu Iida, Yoshikawa Saitama (JP); Satoshi Tanaka, Kawasaki Kanagawa (JP); Takayuki Uchiyama, Yokkaichi Mie (JP)

(73) Assignee: KIOXIA Corporation, Tokyo (JP)

( * ) Notice: Subject to any disclaimer, the term of this patent is extended or adjusted under 35 U.S.C. 154(b) by 456 days.

(21) Appl. No.: 16/812,521

(22) Filed: Mar. 9, 2020

(65) Prior Publication Data

US 2021/0082662 A1 Mar. 18, 2021

(30) Foreign Application Priority Data

Sep. 17, 2019 (JP) .............................. JP2019-168052

(51) Int. Cl.
*H01L 29/45* (2006.01)
*G01B 15/00* (2006.01)
*H01L 29/04* (2006.01)

(52) U.S. Cl.
CPC ............ *G01B 15/00* (2013.01); *H01L 29/045* (2013.01); *G01B 2210/56* (2013.01)

(58) Field of Classification Search
CPC .... G01B 15/00; G01B 2210/56; G01B 15/08; H01L 29/045; H01J 37/263; H01J 2237/2816; H01J 2237/2826; G03F 7/70625
USPC ....................... 250/252.1, 306, 307, 310, 311
See application file for complete search history.

(56) References Cited

U.S. PATENT DOCUMENTS

| | | | |
|---|---|---|---|
| 6,038,018 A | 3/2000 | Yamazaki et al. | |
| 7,365,306 B2 | 4/2008 | Nakayama | |
| 8,373,113 B2 * | 2/2013 | Nakayama | ............ H01J 37/265 250/252.1 |
| 10,012,675 B2 | 7/2018 | Kaneko et al. | |
| 2007/0114449 A1 | 5/2007 | Nakayama | |
| 2008/0165367 A1 | 7/2008 | Moriya et al. | |

(Continued)

FOREIGN PATENT DOCUMENTS

| | | |
|---|---|---|
| JP | H4-274333 A | 9/1992 |
| JP | 2649475 B2 | 9/1997 |
| JP | H11-326247 A | 11/1999 |

(Continued)

OTHER PUBLICATIONS

A. Giussani et al., "Integration of thin Al films on $IN_{0.18}Ga_{0.82}As$ metamorphic grade structures for low-cost III-V photovoltaics," IEEE 44th Photovoltaic Specialist Conference (Jun. 25, 2017), pp. 2514-2519.

*Primary Examiner* — Michael Maskell
(74) *Attorney, Agent, or Firm* — Finnegan, Henderson, Farabow, Garrett & Dunner, LLP

(57) ABSTRACT

A pattern according to an embodiment includes first and second line patterns, each of the first and second line patterns extends in a direction intersecting a <111> direction and has a side surface, the side surface has at least one {111} crystal plane, the side surface of the first line pattern has a first roughness, and the side surface of the second line pattern has a second roughness larger than the first roughness.

20 Claims, 13 Drawing Sheets

(56) References Cited

U.S. PATENT DOCUMENTS

2012/0104254 A1    5/2012    Shishido et al.

FOREIGN PATENT DOCUMENTS

| JP | 2003-262947 A | 9/2003 |
| JP | 2007-139575 A | 6/2007 |
| JP | 2008-31027 A | 2/2008 |
| JP | 2008-83069 A | 4/2008 |
| JP | 5071815 B2 | 11/2012 |
| JP | 5380460 B2 | 1/2014 |
| JP | 5794648 B2 | 10/2015 |

* cited by examiner

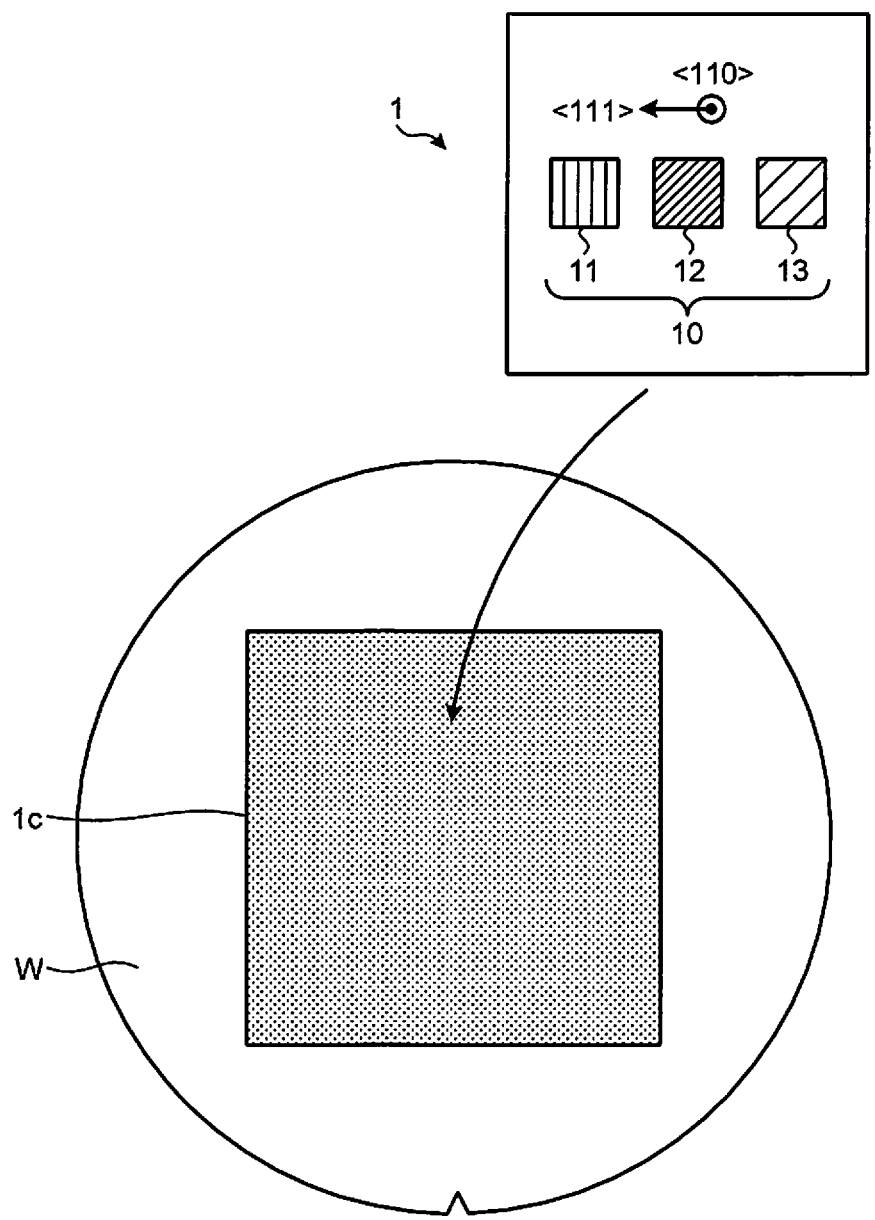

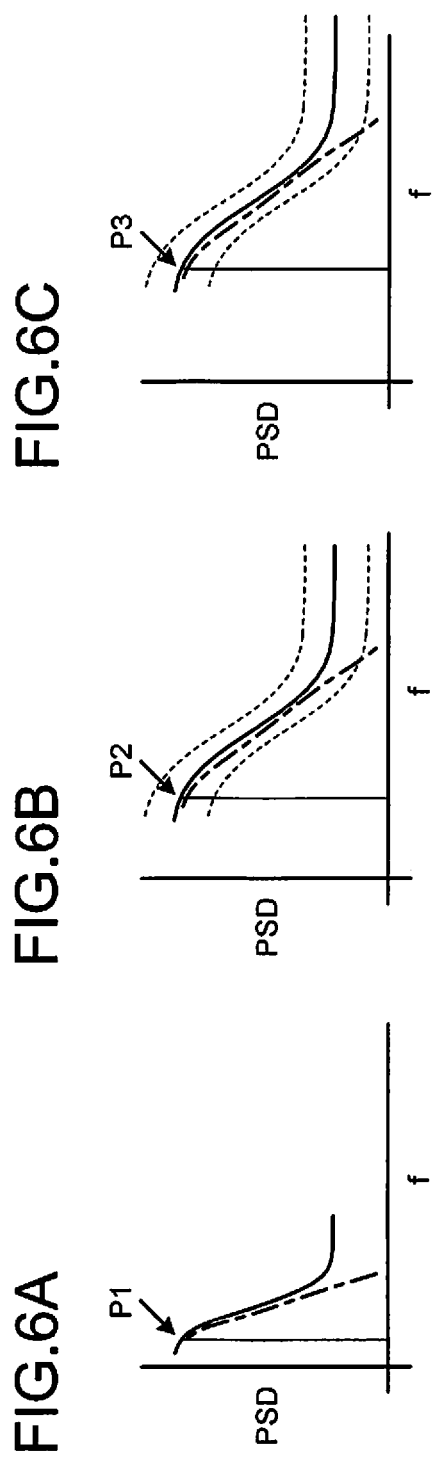

SUBSTRATE AND METHOD FOR CALIBRATION OF MEASUREMENT APPARATUS

CROSS-REFERENCE TO RELATED APPLICATIONS

This application is based upon and claims the benefit of priority from Japanese Patent Application No. 2019-168052, filed on Sep. 17, 2019; the entire contents of which are incorporated herein by reference.

FIELD

Embodiments described herein relate generally to a substrate and a method for calibration of a measurement apparatus.

BACKGROUND

The characteristics of semiconductor devices are greatly affected by line edge roughness (LER) which is roughness in extending direction of a pattern. For calculation of LER based on measurement by a measurement apparatus, such as a CD-SEM, it is necessary to remove noise of the measurement apparatus by calibration.

BRIEF DESCRIPTION OF THE DRAWINGS

FIG. 1 is a plan view schematically illustrating an exemplary configuration of a sample according to a first embodiment;

FIGS. 6A to 6C are graphs schematically illustrating PSD of LER indicated by the pattern of the sample according to the first embodiment;

DETAILED DESCRIPTION

Figures 2A, 2B, 2C:
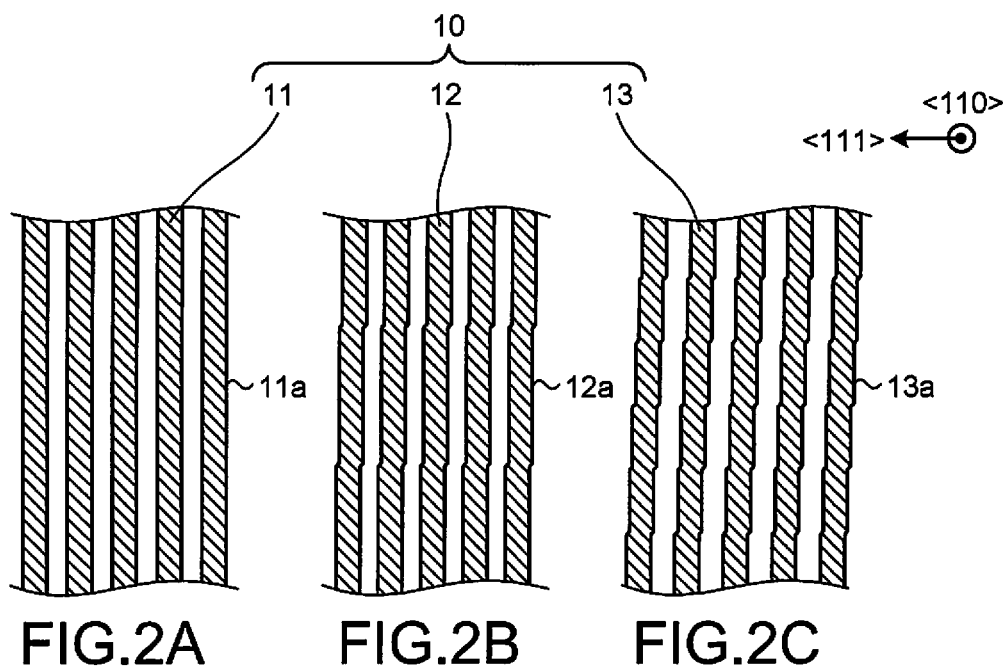
FIGS. 2A to 2F are diagrams schematically illustrating a configuration of a pattern of the sample according to the first embodiment.

A pattern according to an embodiment includes first and second line patterns, each of the first and second line patterns extends in a direction intersecting a <111> direction and has a side surface, the side surface has at least one {111} crystal plane, the side surface of the first line pattern has a first roughness, and the side surface of the second line pattern has a second roughness larger than the first roughness.

Hereinafter, the present invention will be described in detail with reference to the drawings. It should be noted that the present invention is not limited to the following embodiments. Furthermore, component elements in the following embodiments include component elements which are readily conceivable by a person skilled in the art or which are substantially identical.

Note that In this specification, (hkl) represents a specific crystal plane, {hkl} represents equivalent crystal planes, and <hkl> represents equivalent directions.

First Embodiment

Hereinafter, a first embodiment will be described in detail with reference to the drawings.

(Exemplary Configuration of Sample)

FIG. 1 is a plan view schematically illustrating an exemplary configuration of a sample 1 according to the first embodiment. The sample 1 is used as a sample for calibration of a measurement apparatus, such as a critical dimension scanning electron microscope (CD-SEM).

As illustrated in FIG. 1, the sample 1 has, for example, a rectangular flat plate. A pattern 10 is arranged on the main surface of the sample 1. The pattern 10 includes a line pattern 11 as a first line pattern, a line pattern 12 as a second line pattern, and a line pattern 13 as a third line pattern. Details thereof will be described later.

The sample 1 is obtained by cutting, for example, a 150 mm or 200 mm silicon substrate having a (110) plane as a main surface, into a chip shape. Therefore, the main surface of the sample 1 has the (110) plane. A direction along the main surface of the sample 1 is a <111> direction, and a direction perpendicular to the main surface is a <110> direction.

The sample 1 is used by being fitted into a wafer W such as a 150 mm substrate, 200 mm substrate, or 300 mm substrate having a counterbore 1c. Thereby, the sample 1 can be used in various measurement apparatuses having different transport systems for the 150 mm substrate, 200 mm substrate, 300 mm substrate, and the like.

Figures 2D, 2E, 2F:
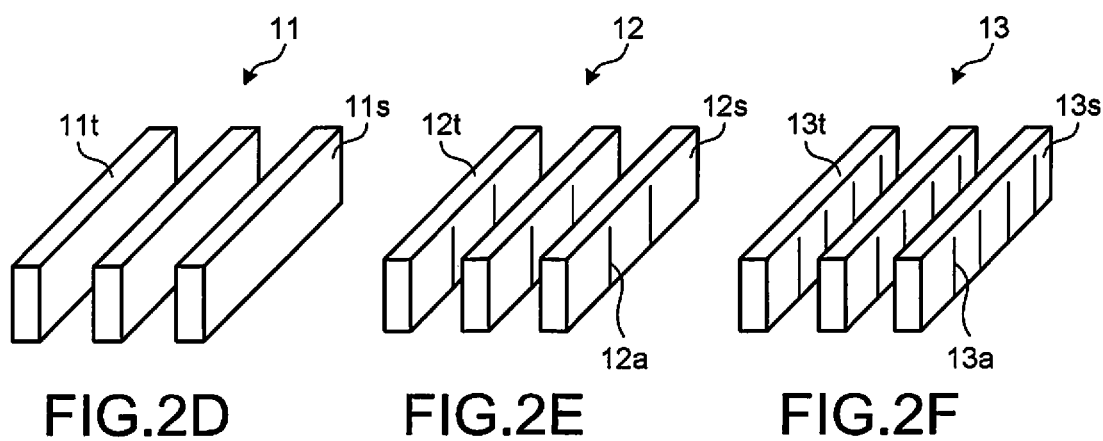

FIGS. 2A to 2F are diagrams schematically illustrating a configuration of a pattern 10 of the sample 1 according to the first embodiment. FIGS. 2A to 2C are plan views of the pattern 10, and FIGS. 2D to 2F are perspective views of the pattern 10.

As illustrated in FIGS. 2A to 2F, the line patterns 11 to 13 of the pattern 10 have line and space (LS) patterns each including a plurality of lines. The plurality of lines extends in a direction intersecting a <111> direction which is a crystal orientation of a diamond structure of silicon. The direction intersecting a <111> direction is, for example, a direction perpendicular to a <111> direction. Furthermore, for example, the direction intersecting a <111> direction may not be completely perpendicular to a <111> direction.

More specifically, the line pattern 11 of the line patterns 11 to 13 extends in a direction closest to the direction perpendicular to a <111> direction. The line pattern 12 is turned, for example, clockwise by 0.2° relative to the line pattern 11. The line pattern 13 is turned, for example, clockwise by 0.4° relative to the line pattern 11.

Upper surfaces 11t to 13t of the plurality of lines include the (110) plane which is the main surface of the sample 1. Side surfaces 11s to 13s of the plurality of lines in the extending direction each have at least one {111} crystal plane. The line pattern 11 is substantially perpendicular to the <111> direction, and the side surfaces 11s are constituted by a substantially single {111} crystal plane. A roughness, that is, line edge roughness (LER) of each of the side surfaces 11s of the line pattern 11 is substantially zero.

The line pattern 12 is turned slightly relative to the direction perpendicular to a <111> direction. In this configuration, an atomic step 12a appears on each of the side surfaces 12s of the line pattern 12 with a crystallographic period.

Here, the atomic step represents an atomic layer step difference appearing on a crystal surface and having a height of one to several atoms. The height of the atomic step is determined according to the crystal plane. In silicon {111} plane, an atomic step having a height of one atom is 3.14 Å (approximately 0.3 nm). A period of atomic step represents an interval between atomic steps and differs depending on the amount of deviation between the extending direction of a line pattern and a crystal orientation. When the amount of deviation is large, the interval between atomic steps decreases, and when the amount of difference is small, the interval between atomic steps increases.

The line pattern 12 has a predetermined LER due to the atomic steps 12a periodically appearing on the side surface 12s. For example, in a case where the atomic step 12a has a height of one atom, the line pattern 12 has an LER of 0.3 nm and LER (30) of 0.9 nm.

The line pattern 13 is further turned relative to the direction perpendicular to a <111> direction, as compared with the line pattern 12. Therefore, an atomic step 13a appears on each of the side surfaces 13s of the line pattern 13 with a shorter period than the line pattern 12. The line pattern 13 has the same LER, for example, as the line pattern 12.

(Method of Manufacturing Sample)

Figure 3A:
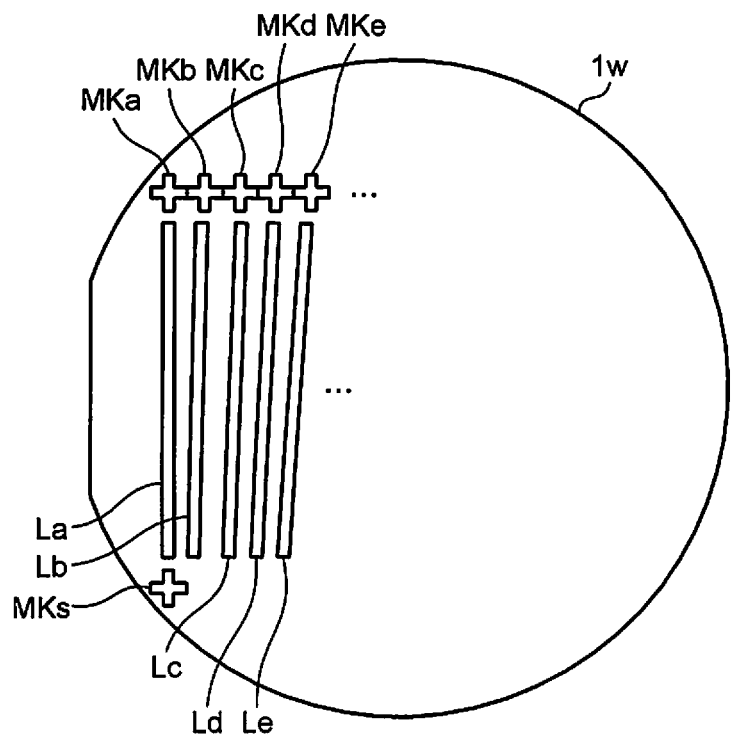
FIGS. 3A and 3B are schematic diagrams illustrating an example of a procedure of a method of manufacturing the sample according to the first embodiment.
Figure 3B:
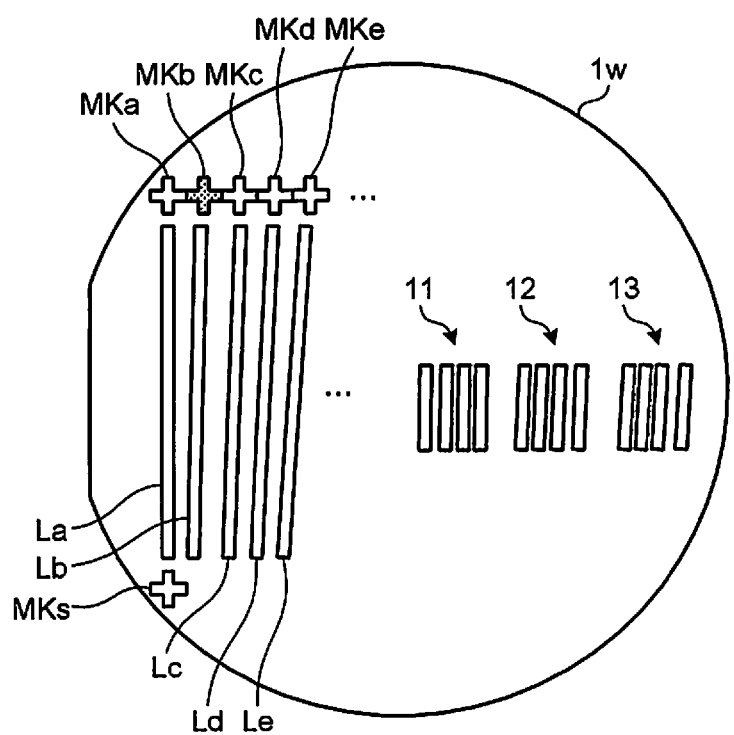

Next, a method of manufacturing the sample 1 according to the first embodiment will be described with reference to FIGS. 3A and 3B. FIGS. 3A and 3B are schematic diagrams illustrating an example of a procedure of the method of manufacturing the sample 1 according to the first embodiment.

As illustrated in FIG. 3A, lines La to Le setting conditions are formed on a silicon wafer 1w having a (110) plane as a main surface. The lines La to Le are turned clockwise, for example, by 0.1° relative to an alignment mark MKs as a reference. The lines La to Le also have alignment marks MKa to MKe, respectively.

Such lines La to Le and alignment marks MKa to MKe and MKs are obtained by forming a resist pattern, for example, by electron beam drawing or the like, and wet etching the wafer 1w to a predetermined depth with an alkaline etching solution such as a KOH solution, using this resist pattern as a mask.

Wet etching with a KOH solution or the like has different wet etching rates according to the crystal plane. The {111} crystal plane having the slowest wet etching rate appears on the side surfaces of the lines La to Le. Atomic steps are generated due to slight deviation of the extending directions of the lines La to Le from a perfect crystal plane orientation.

It is confirmed whether which of the lines La to Le thus obtained has an extending direction closest to a direction perpendicular to a <111> direction. In other words, it is only necessary to select a line with no atomic step or a line having the smallest number of atomic steps, from the lines La to Le. Here, it is assumed that the line Lb corresponds thereto. In this case, the line pattern 11 is formed to have the same rotation angle as the line Lb.

As illustrated in FIG. 3B, in forming the line pattern 11, a resist pattern is formed according to the alignment mark MKb provided at the line Lb and the alignment mark MKs which serves as the reference, and wet etching is performed on the wafer 1w.

In forming the line pattern 12, a resist pattern is formed according to the alignment mark MKd of the line Ld, which is turned by 0.2° relative to the line Lb, and the alignment mark MKs, and wet etching is performed on the wafer 1w.

In forming the line pattern 13, a resist pattern is formed according to an alignment mark of a line, which is further turned by 0.2° from the line Ld, and the alignment mark MKs, and wet etching is performed on the wafer 1w.

Thus, the {111} crystal plane appears on the side surfaces of each of the line patterns 11 to 13.

Furthermore, the atomic steps are formed on the side surfaces according to the rotation angle relative to the direction perpendicular to <111>.

As described above, the sample 1 according to the first embodiment is manufactured.

(Exemplary Configuration of Measurement Apparatus)

Figure 4:
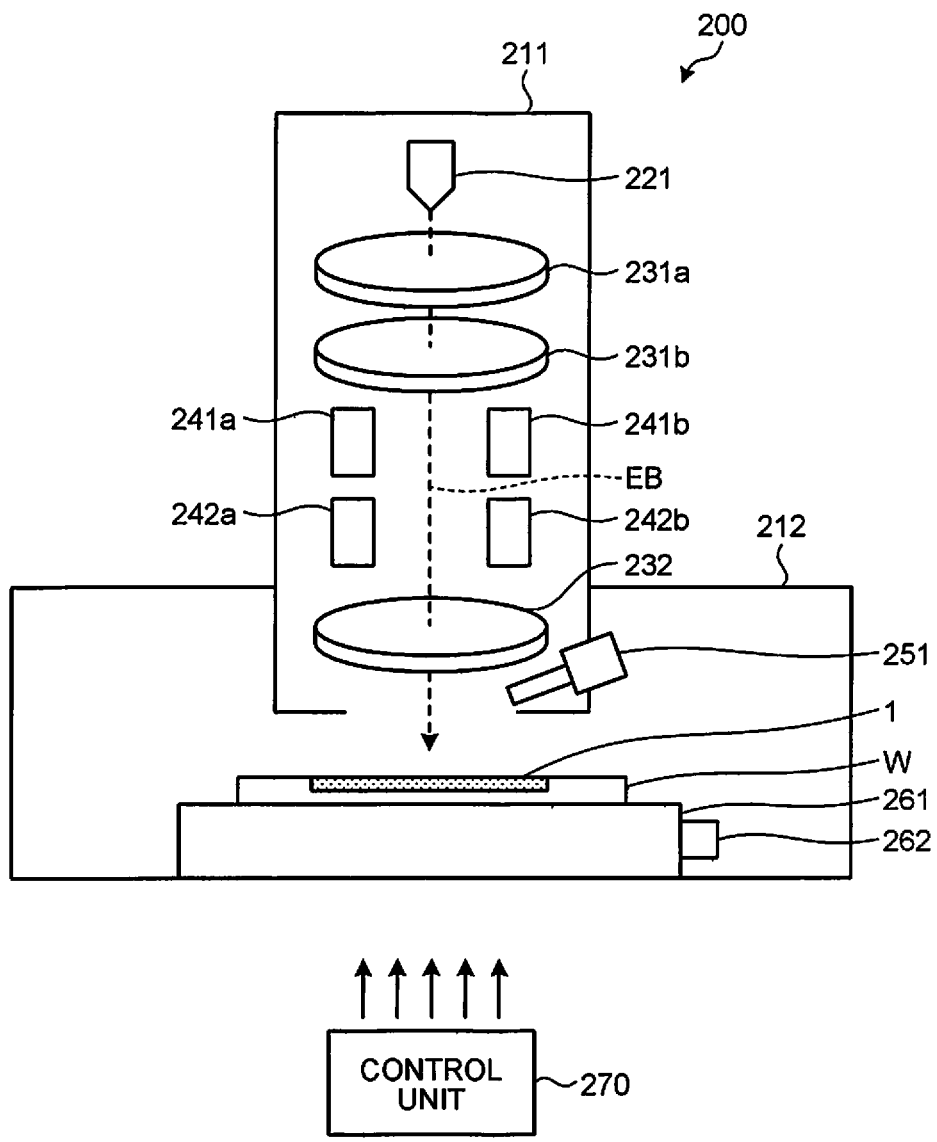
FIG. 4 is a schematic diagram illustrating an exemplary configuration of a measurement apparatus according to the first embodiment.

Next, an exemplary configuration of a measurement apparatus 200 for calibration using the sample 1 will be described with reference to FIGS. 4 and 5. FIG. 4 is a schematic diagram illustrating an exemplary configuration of the measurement apparatus 200 according to the first embodiment. The measurement apparatus 200 is configured as a CD-SEM for measurement of, for example, a critical dimension shift, LER, and the like of a pattern.

As illustrated in FIG. 4, the measurement apparatus 200 includes a lens barrel 211 in which an electron gun 221 as an emission source for electron beam EB is installed, a sample chamber 212 in which the wafer W is arranged, and a control unit 270 configured to control each unit of the measurement apparatus 200.

The lens barrel 211 has a cylindrical shape and includes an upper end portion being closed and a lower end portion being opened to cause the electron beam EB to pass therethrough. The sample chamber 212 is configured to store the wafer W. The lens barrel 211 and the sample chamber 212 are combined in an airtightly sealed state. The insides of the lens barrel 211 and the sample chamber 212 are configured to be held at a reduced pressure by a pump or the like, which is not illustrated.

In the lens barrel 211, the electron gun 221, the condenser lenses 231a and 231b, the coils 241a, 241b, 242a, and 242b, an objective lens 232, and a detector 251 are installed in this order from the vicinity of the upper end portion.

The electron gun 221 emits the electron beam EB downward in the lens barrel 211. The electron beam EB emitted from the electron gun 221 travels in a long axis direction of the lens barrel 211.

The condenser lenses 231a and 231b each have an electromagnetic coil wound concentrically about an optical axis of the lens barrel 211 and focus the electron beam EB by a magnetic field.

The coils 241a, 241b, 242a, and 242b are a pair of two electromagnetic coils configured to deflect the electron beam EB or correct astigmatism and are arranged symmetrically about the optical axis of the lens barrel 211.

The objective lens 232 has an electromagnetic coil wound concentrically about the optical axis of the lens barrel 211 and focuses the electron beam EB emitted toward the wafer W by a magnetic field.

The detector 251 detects secondary electrons generated from the wafer W on which the electron beam EB is incident.

A wafer stage 261 on which a wafer W is placed is installed in the sample chamber 212. An actuator 262 is mounted to the wafer stage 261 and configured to drive the wafer stage 261 back and forth and left and right. Driving of the wafer stage 261 enables to cause the electron beam EB to be emitted to a predetermined point on the wafer W and to be incident on the wafer W.

The control unit 270 is configured as a computer including a central processing unit (CPU), a random access memory (RAM), a storage device, an I/O port, and the like.

Figure 5:
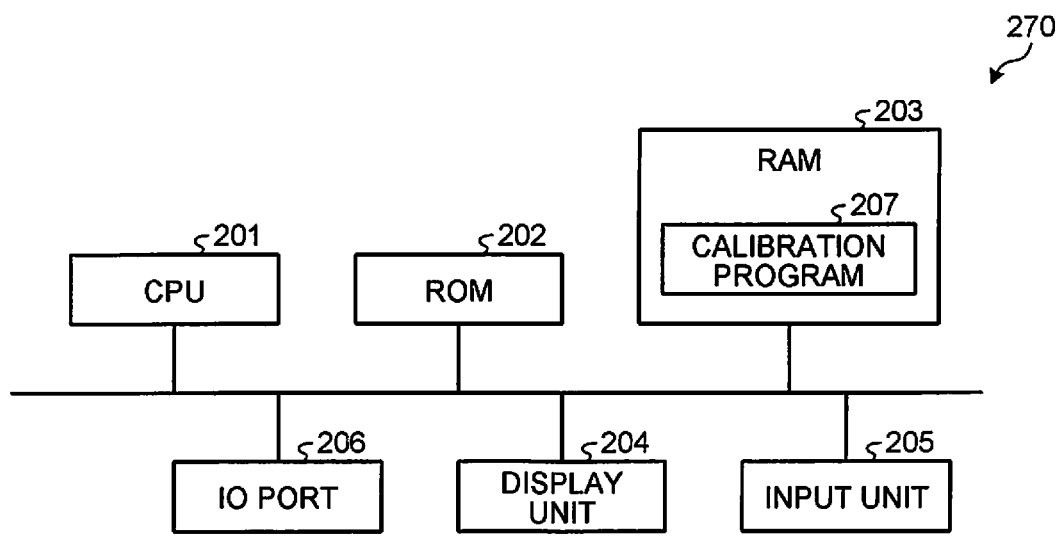
FIG. 5 is a block diagram illustrating an exemplary hardware configuration of a control unit of the measurement apparatus according to the first embodiment.

FIG. 5 is a block diagram illustrating an exemplary hardware configuration of the control unit 270 of the measurement apparatus 200 according to the first embodiment.

As illustrated in FIG. 5, the control unit 270 of the measurement apparatus 200 includes a CPU 201, a read only memory (ROM) 202 as a storage device, RAM 203, a display unit 204, an input unit 205, and an IO port 206. In the control unit 270, these CPU 201, ROM 202, RAM 203, display unit 204, input unit 205, and IO port 206 are connected via a bus line.

The CPU 201 performs measurement by the measurement apparatus 200, using various control programs. Furthermore, the CPU 201 calibrates the measurement apparatus 200 by using a calibration program 207 being a computer program. The calibration program 207 includes a computer program product having a computer readable recording medium including a plurality of instructions for calibration, which is executable by a computer. In the calibration program 207, the plurality of instructions causes the computer to perform a calibration process of the measurement apparatus 200.

The display unit 204 has a display device, such as a liquid crystal monitor, and displays a result of measurement by the measurement apparatus 200, calibration parameters, and the like, according to an instruction from the CPU 201. The input unit 205 includes a mouse, a keyboard, and the like and inputs instruction information, such as a parameter required for measurement or calibration, input from outside by the user. The instruction information input to the input unit 205 is transmitted to the CPU 201.

The IO port 206 is connected to the electron gun 221, the condenser lenses 231a and 231b, the coils 241a, 241b, 242a, and 242b, the objective lens 232, the detector 251, the actuator 262 of the wafer stage 261, and the like.

The CPU 201 controls the electron gun 221, the condenser lenses 231a and 231b, the coils 241a, 241b, 242a, and 242b, the objective lens 232, the detector 251, the actuator 262 of the wafer stage 261, and the like via the IO port 206, according to the contents of a control program read from the ROM 202 or the like.

The calibration program 207 is stored in the ROM 202 together with calibration parameters and the like and is loaded into the RAM 203 via the bus line. FIG. 5 illustrates a state in which the calibration program 207 is loaded into the RAM 203.

The CPU 201 executes the calibration program 207 loaded into the RAM 203. Specifically, in the control unit 270, according to an instruction input by the user from the input unit 205, the CPU 201 reads the calibration program 207 from the ROM 202, deploys the calibration program 207 in a program storage area in the RAM 203, and performs various calibration processes. The CPU 201 temporarily stores various data generated in the various calibration processes, in a data storage area formed in the RAM 203. When each of the calibration processes is completed, the calibration parameters are updated.

The calibration program 207 executed by the control unit 270 includes modules, and these modules are loaded on the main storage device and generated on the main storage device.

(Method for Calibration of Measurement Apparatus)

Next, with reference to FIGS. 6A to 9, a method for calibration of the measurement apparatus 200 will be described, the method being performed by using the sample 1 according to the first embodiment.

Calibration of the measurement apparatus 200 is performed, for example, for the LER and correlation length $\xi$ of a pattern. The correlation length $\xi$ is an index of how often the same periodic structure is repeated. In terms of the LER of the pattern 10 of the sample 1, the correlation length $\xi$ corresponds to an interval at which atomic steps appear. Unlike the sample 1, in measurement of an actual pattern having a random LER, the correlation length $\xi$ is one of the important parameters, in addition to a value of the LER, and it is also very important to calibrate the correlation length $\xi$ accurately.

The sample 1 is a calibration sample having a predetermined crystal plane and a known LER and correlation length $\xi$ using atomic steps appearing on the crystal plane. Furthermore, the LER of the sample 1 is very small. Use of such a sample 1 enables accurate calibration of the measurement apparatus 200.

FIGS. 6A to 6C are graphs schematically illustrating a power spectral density function (PSD) of the LER indicated by the pattern 10 of the sample 1 according to the first embodiment. The PSD represents a power distribution of a continuous signal for each frequency band.

In each graph of FIGS. 6A to 6C, a horizontal axis represents frequency (f), and a vertical axis represents PSD. Furthermore, in each of the graphs, a solid line indicates actual measurement values of the pattern 10 measured by the measurement apparatus 200, and a broken line indicates an acceptable range of accuracy in actual measurement value. Furthermore, an alternate long and short dash line in each graph is a plot of values obtained by removing noise components from an image obtained by the measurement apparatus 200.

The correlation lengths $\xi$ of the LERs of the pattern 10 can be determined, for example, as reciprocals of the frequencies at points P1 to P3 that are 1/e lower than values of flat regions of the graphs at low frequencies. Here, "e" represents a base of a natural logarithm.

As illustrated in FIG. 6A, the PSD of the line pattern 11 in which the LER is regarded as zero and the correlation length $\xi$ is infinite is ideally a delta function. However, since a noise component resulting from an image of the measurement apparatus 200 appears, values indicated by the solid line are obtained as actual measurement values. The correlation length $\xi$ obtained from the point P1 of the graph is not infinite.

As illustrated in FIG. 6B, the PSD of the line pattern 12 having the atomic steps appearing with a predetermined period shows a gentler gradient than the PSD of the line pattern 11, and the correlation length $\xi$ obtained from the point P2 is smaller than that of the line pattern 11.

As illustrated in FIG. 6C, the PSD of the line pattern 13 having the atomic steps appearing with a smaller period shows a gentler gradient than the PSD of the line pattern 12, and the correlation length $\xi$ obtained from the point P3 is smaller than that of the line pattern 12.

Figure 7A:
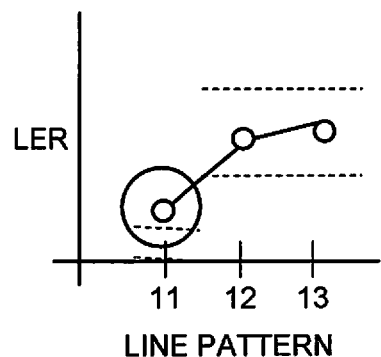
FIGS. 7A to 7C are graphs each illustrating an example of actual measurement values of LER and correlation length $\xi$ indicated by line patterns of the sample according to the first embodiment and line patterns of a certain sample.
Figure 7B:
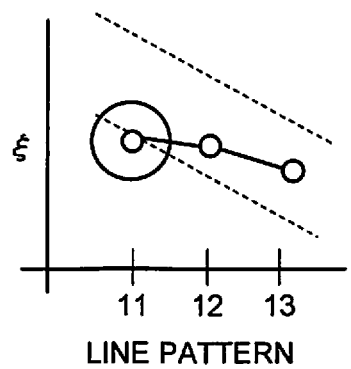
Figure 7C:
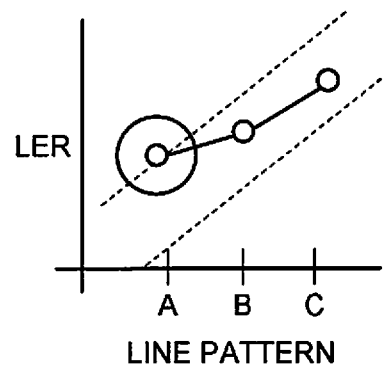

FIGS. 7A to 7C are graphs each illustrating an example of actual measurement values of the LER and correlation length $\xi$ indicated by the line patterns 11 to 13 of the sample 1 according to the first embodiment and line patterns A to C of a certain sample.

FIG. 7A is a graph of the LERs of the line patterns 11 to 13, in which a solid line indicates actual measurement values and a broken line indicates an acceptable range of accuracy in actual measurement value. In the graph, the horizontal axis represents the line patterns 11 to 13 and the vertical axis represents LER. FIG. 7B is a graph of the correlation lengths $\xi$ of the line patterns 11 to 13, in which a solid line indicates actual measurement values and a broken line indicates an acceptable range of accuracy in actual measurement value. In the graph, the horizontal axis represents the line patterns 11 to 13 and the vertical axis represents correlation length $\xi$. FIG. 7C is a graph of the LERs of line patterns A to C of a certain sample, in which a solid line indicates actual measurement values and a broken line indicates an acceptable range of accuracy in actual measurement value. In the graph, the horizontal axis of the graph represents the line patterns A to C and the vertical axis represents LER.

In the examples of FIGS. 7A and 7B, the actual measurement values of the LERs and correlation lengths $\xi$ of the line patterns 12 and 13 are within the acceptable range. However, the actual measurement values of both of the LER and the correlation length $\xi$ of the line pattern 11 are out of the acceptable range. In other words, in the examples of FIGS. 7A and 7B, it can be seen that the measurement apparatus 200 needs to correct the measurement value when the LER is infinitesimally small, that is, substantially zero.

In such a state, when the LERs of the line patterns A to C of an actual sample which is the certain sample are measured, the actual measurement value of the line pattern A having a smaller LER is out of the acceptable range as well, as illustrated in FIG. 7C.

Figure 8A:
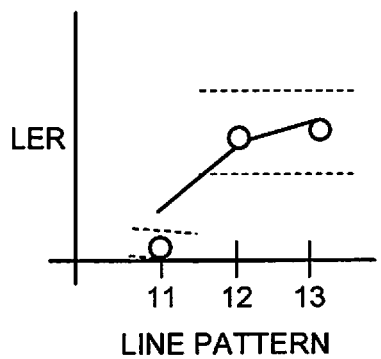
FIGS. 8A to 8C are graphs each illustrating an example of actual measurement values obtained after calibration of the LER and correlation length $\xi$ indicated by the line patterns of the sample according to the first embodiment and the line patterns of the certain sample.
Figure 8B:
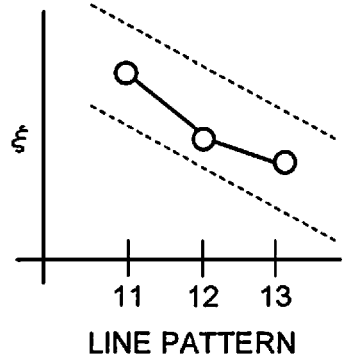
Figure 8C:
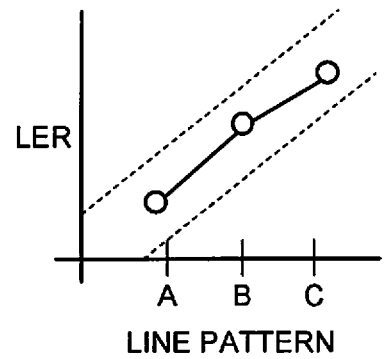

FIGS. 8A to 8C are graphs each illustrating an example of actual measurement values obtained after calibration of the LER and correlation length $\xi$ indicated by the line patterns 11 to 13 of the sample 1 according to the first embodiment and the line patterns A to C of the certain sample.

FIG. 8A is a graph of the LERs of the line patterns 11 to 13, in which a solid line indicates actual measurement values of the measurement apparatus 200 after calibration and a broken line indicates an acceptable range of accuracy in actual measurement value. In the graph, the horizontal axis represents the line patterns 11 to 13 and the vertical axis represents LER. FIG. 8B is a graph of the correlation lengths $\xi$ of the line patterns 11 to 13, in which a solid line indicates actual measurement values of the measurement apparatus 200 after calibration and a broken line indicates an acceptable range of accuracy in actual measurement value. In the graph, the horizontal axis represents the line patterns 11 to 13 and the vertical axis represents correlation length $\xi$. FIG. 8C is a graph of the LERs of the line patterns A to C of the certain sample, in which a solid line indicates actual measurement values and a broken line indicates an acceptable range of accuracy in actual measurement value. In the graph, the horizontal axis of the graph represents the line patterns A to C and the vertical axis represents LER.

As illustrated in FIGS. 8A and 8B, all plots of the line patterns 11 to 13 are within the acceptable range. Calibration using the sample 1 having a known LER and correlation length $\xi$ enables subsequent highly precise measurement of a sample having an unknown and random LER and correlation length $\xi$ in the measurement apparatus 200, as illustrated in FIG. 8C.

Note that in FIGS. 7A to 7C, the examples are illustrated in which as the LERs decrease and the correlation lengths $\xi$ increase, the actual measurement values measured by the measurement apparatus 200 are deviated, but the tendency of deviation in actual measurement values measured by the measurement apparatus, which is identifiable according to the sample 1, is not limited to this example. For example, in some measurement apparatuses, an actual measurement value may be deviated as the LER increases or the correlation length $\xi$ decreases, or an actual measurement value may be deviated in terms of a specific LER and correlation length $\xi$, and use of the sample 1 allows understanding of such a tendency.

Figure 9:
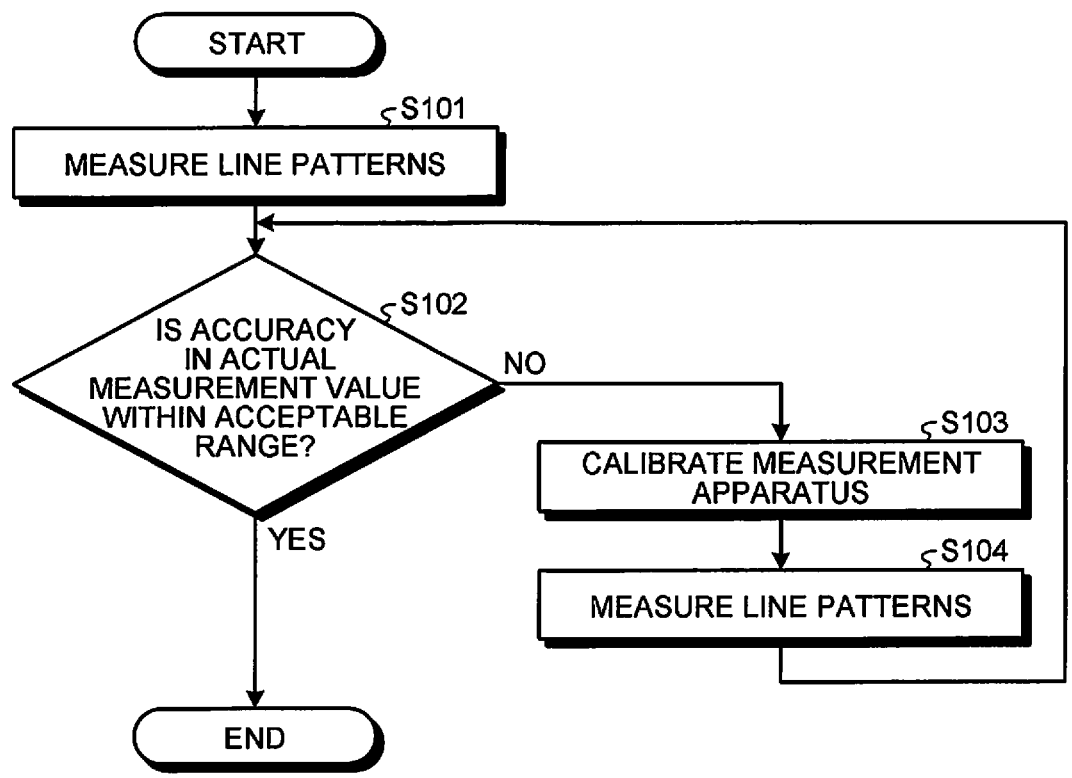
FIG. 9 is a flowchart illustrating an example of a procedure of a method for calibration of a measurement apparatus by using the sample according to the first embodiment.

FIG. 9 is a flowchart illustrating an example of a procedure of the method for calibration of the measurement apparatus 200 by using the sample 1 according to the first embodiment.

As illustrated in FIG. 9, each of the line patterns 11 to 13 of the sample 1 is measured by the measurement apparatus 200 to acquire actual measurement values of the LER and correlation length $\xi$ (step S101).

It is determined whether the obtained actual measurement values have an accuracy within an acceptable range (step S102).

If an actual measurement value does not have an accuracy within the acceptable range (step S102: No), the measurement apparatus 200 is calibrated (step S103).

After the calibration of the measurement apparatus 200, the line patterns 11 to 13 of the sample 1 are measured again to acquire the actual measurement values of the LER and correlation length $\xi$ (step S104).

It is determined whether the obtained actual measurement values have an accuracy within an acceptable range (step S102). If the actual measurement values have an accuracy within the acceptable range (step S102: Yes), the process ends.

This is the end of the calibration of the measurement apparatus 200 by using the sample 1 according to the first embodiment.

Comparative Example

LER measured by a measurement apparatus such as CD-SEM tends to have a large value due to the influence of noise. Therefore, as a configuration of the comparative example, a calculation method has been proposed to subtract a noise component with software by calibrating the measurement apparatus.

However, there is no standard calculation method, and even if measured by using the same sample, the values of LER and correlation length $\xi$ differ. Furthermore, there are various problems that there is no standard sample having a known LER and correlation length $\xi$ and accuracy in obtained LER and correlation length $\xi$ cannot be verified. It is considered that a sample enabling measurement of an LER of 2 nm or less, which will be required in the future, will be required as the standard sample.

However, in microfabrication using optical lithography or electron beam lithography, it is very difficult to intentionally manufacture a standard sample having an LER of 2 nm or less.

The sample 1 according to the first embodiment includes the line patterns 11 to 13 extending in a direction intersecting a <111> direction and having side surfaces having at least one {111} crystal plane in the extending direction. Thus, the sample 1 can be obtained to have a known LER and correlation length $\xi$. The LER caused by atomic steps is very small, and the sample 1 enables calibration of the measurement apparatus 200, for example, on the basis of an LER of approximately 1 nm.

The sample 1 according to the first embodiment is used by being fitted into wafers W of various sizes. Thus, the sample 1 can be used in common for various measurement apparatuses 200. Therefore, in any of various measurement apparatuses 200, these measurement apparatuses 200 can be calibrated to obtain the same measurement result for the same sample.

Note that the sample 1 according to the first embodiment has a chip shape and is used by being fitted into the wafer W, but the sample 1 is not limited thereto. The wafer 1w on which the pattern 10 has been formed may be directly used for measurement by the measurement apparatus 200 and calibration of the measurement apparatus 200 without being cut into chips.

Furthermore, as described above, the atomic step can have a height of one to several atoms, and adjustment of the number of atoms constituting the height of the atomic step enables to measure various LERs. As described above, when the atomic step has a height of one atom, the LER is 0.3 nm (LER (3σ) is 0.9 nm). The atomic step having a height of two atoms has a step difference of 6.28 Å, and the LER is 0.6 nm (LER (3σ) is 1.8 nm).

The number of atoms constituting the atomic step can be increased by increasing the rotation angle of the line pattern. In other words, as a deviation from a direction orthogonal to a <111> direction increases, an atomic step tends to have a large step difference. Thereby, the interval between the atomic steps, that is, the correlation length $\xi$ can also be adjusted to be reduced.

The step difference of atomic step and an interval between the atomic steps are also controllable according to an etching solution, wet etching conditions, or the like.

Furthermore, a wafer having a (110) plane as a main surface and being a material of a sample may be a wafer having multi-element crystal which is a zincblende crystal structure, such as GaAs or GaSn, in addition to silicon. For example, GaAs has a lattice spacing slightly different from that of silicon, and GaAs has a spacing between {111} crystal planes of 3.26 Å, which is slightly larger than that of silicon. Thus, the size of the LER is controllable by variously selecting a material for the wafer.

(First Modification)

Figure 10:
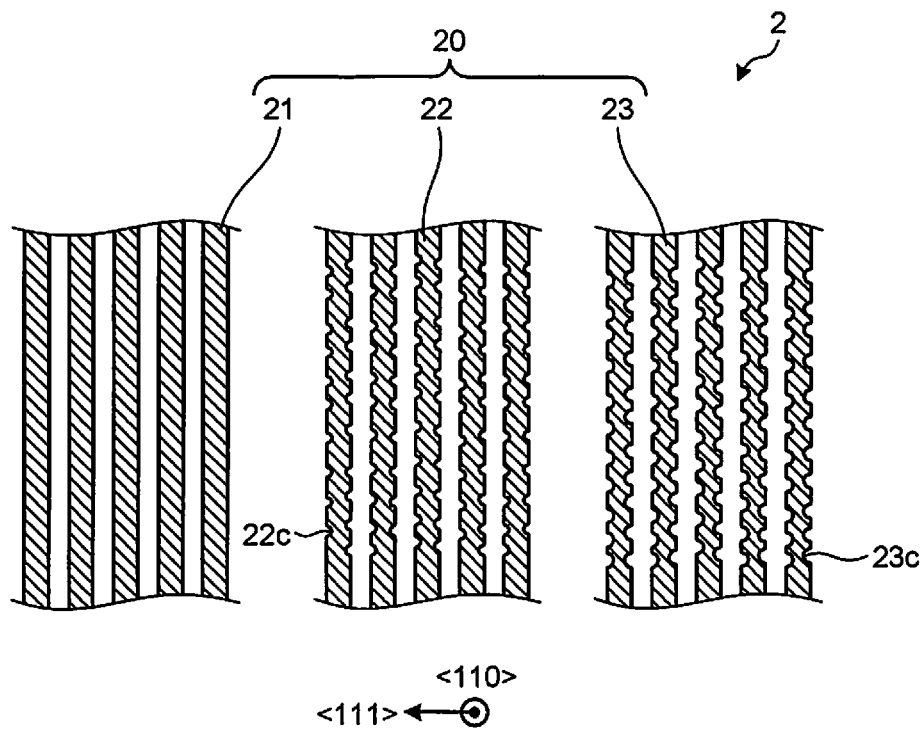
FIG. 10 is a plan view schematically illustrating a configuration of a pattern of a sample according to a first modification of the first embodiment.

Next, a sample 2 according to a first modification of the first embodiment will be described with reference to FIG. 10. FIG. 10 is a plan view schematically illustrating a configuration of a pattern 20 of the sample 2 according to the first modification of the first embodiment. The sample 2 according to the first modification is different from the sample 1 according to the first embodiment described above in that the period of LER is random.

As illustrated in FIG. 10, the sample 2 has a main surface being a (110) plane, and on the main surface, the pattern 20 is arranged. The pattern 20 includes a line pattern 21 as a first line pattern, a line pattern 22 as a second line pattern, and a line pattern 23 as a third line pattern.

The line patterns 21 to 23 extend in a direction substantially perpendicular to a <111> direction. In other words, a base pattern of the line patterns 21 to 23 is configured similarly to the line pattern 11 according to the first embodiment, having an LER of substantially zero and a correlation length $\xi$ being infinite in principle.

On the basis of such a line pattern, the LER having a random period is introduced into the line patterns 22 and 23. Such line patterns 22 and 23 can be formed by providing minute irregularities 22c and 23c roughened on side surfaces of the line patterns 22 and 23, for example, by asking, dry etching, or the like.

Furthermore, the line pattern 23 has a larger LER than the line pattern 22. The LER is adjustable by changing the conditions of ashing or dry etching. For example, in a case where ashing is adopted, larger LER can be obtained by increasing plasma generation voltage or increasing a processing time. In a case where dry etching is adopted, in addition to the above method, different LER can be obtained by selective performing etching with a resist pattern having a predetermined LER as a mask.

In order to make the LERs and correlation lengths $\xi$ of the line patterns 22 and 23 known, for example, it is preferable to form dummy patterns in advance according to the conditions of ashing or dry etching to be used, observe the dummy patterns or the like with a transmission electron microscope (TEM) or the like, and acquire the values of the LER and correlation lengths $\xi$.

Note that the line pattern 21 is not subjected to the ashing, dry etching, or the like and has an initial mirror surface.

(Second Modification)

Figure 11:
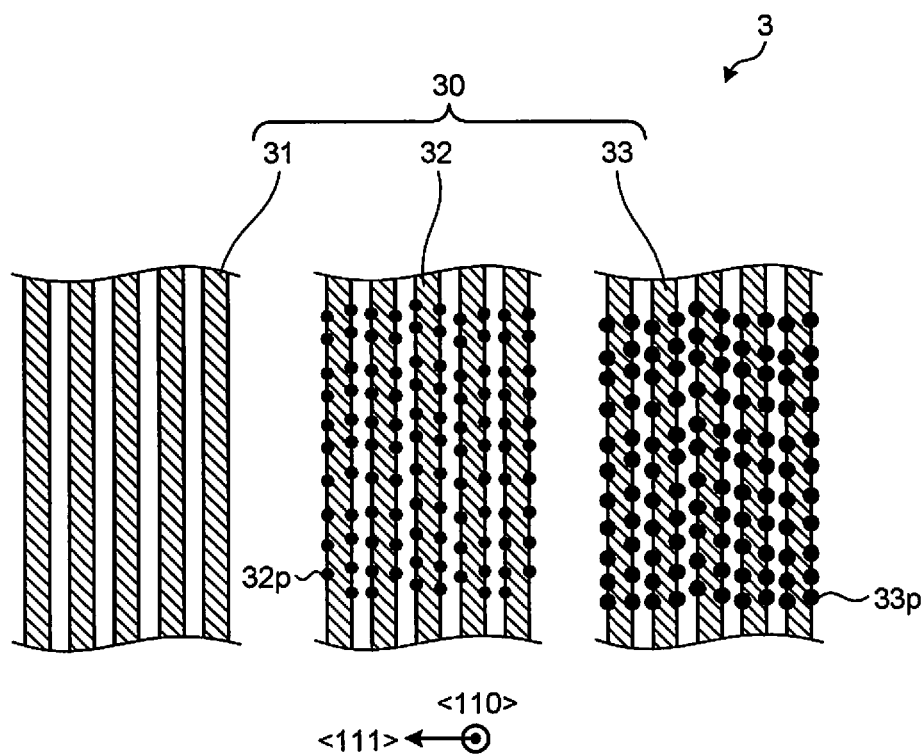
FIG. 11 is a plan view schematically illustrating a configuration of a pattern of a sample according to a second modification of the first embodiment.

Next, a sample 3 according to a second modification of the first embodiment will be described with reference to FIG. 11. FIG. 11 is a plan view schematically illustrating a configuration of a pattern 30 of the sample 3 according to the second modification of the first embodiment. The sample 3 according to the second modification is different from the sample 2 according to the first modification described above in a method of introducing LER.

As illustrated in FIG. 11, the sample 3 has a main surface being a (110) plane, and on the main surface, the pattern 30 is arranged. The pattern 30 includes a line pattern 31 as a first line pattern, a line pattern 32 as a second line pattern, and a line pattern 33 as a third line pattern.

The line patterns 31 to 33 extend in a direction substantially perpendicular to a <111> direction. In other words, a base pattern of the line patterns 31 to 33 is configured similarly to the line pattern 11 according to the first embodiment described above, having an LER of substantially zero and a correlation length $\xi$ being infinite in principle.

On the basis of such a line pattern, the LER having a random period is introduced into the line patterns 32 and 33 using particles 32p and 33p. In other words, the particles 32p and 33p with known particle sizes are attached to the line patterns 32 and 33, respectively. A particle 33p attached to the line pattern 33 is assumed to have a larger particle size than a particle 32p attached to the line pattern 32.

Note that the line pattern 31 has no particle and has an initial mirror surface.

Second Embodiment

Hereinafter, a second embodiment will be described in detail with reference to the drawings. The second embodiment is different from the first embodiment described above in configuration in which a silicon-on-insulator (SOI) wafer is used as a substrate being a material of a sample.

Figure 12:
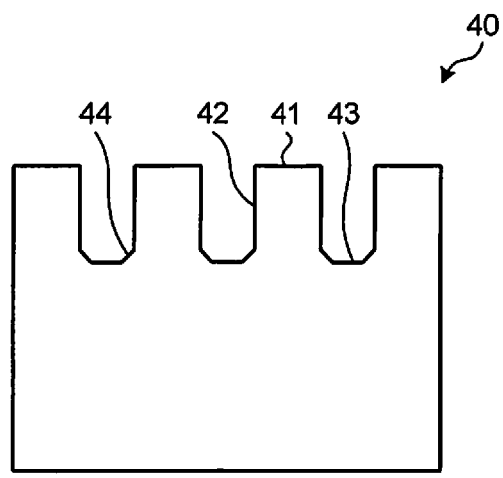
FIG. 12 is a schematic diagram illustrating various crystal planes of a certain line pattern.

FIG. 12 is a schematic diagram illustrating various crystal planes of a certain line pattern 40. The line pattern 40 has lines extending in a direction substantially perpendicular to a <111> direction on a substrate having a (110) plane as a main surface.

As illustrated in FIG. 12, the line pattern 40 has a side surface 42 having a {111} crystal plane substantially perpendicular to an upper surface 41 having the (110) plane, and a foot portion 44 positioned at a joined portion with a bottom surface 43 having the (110) plane. The foot portion 44 has another {111} crystal plane that appears when the line pattern 40 is formed (reference: Micro and Nano Engineering 3 (2019) 44-49). The {111} crystal plane of the foot portion 44 has an angle different from the {111} crystal plane of the side surface 42.

For example, when measurement is performed by the measurement apparatus 200 or the like or when a microscope has a large focal depth, an oblique {111} crystal plane, such as the foot portion 44 described above, in an image may blur the outline of the line pattern 40.

The configuration of the second embodiment described below suppresses the formation of the oblique {111} crystal plane.

(Method of Manufacturing Sample)

Figure 13A:
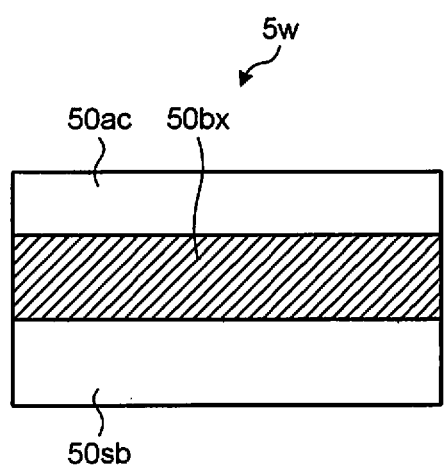
FIGS. 13A and 13B are cross-sectional views schematically illustrating an SOI wafer being a material of a sample according to a second embodiment and a line pattern of the sample.
Figure 13B:
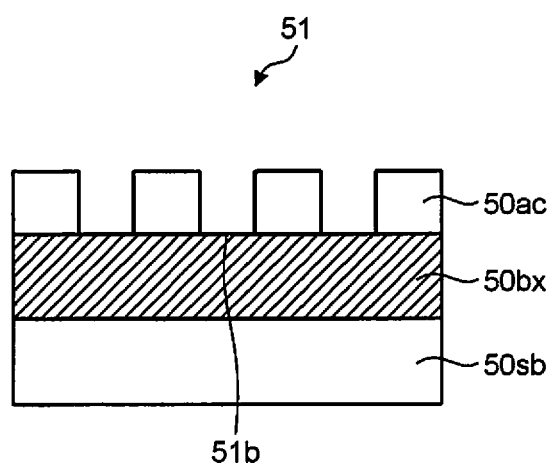

FIGS. 13A and 13B are cross-sectional views schematically illustrating an SOI wafer 5w being a material of a sample according to the second embodiment and a line pattern 51 of the sample.

As illustrated in FIG. 13A, the SOI wafer 5w includes a substrate 50sb including silicon or the like, a box layer 50bx including an insulating layer such as a silicon oxide layer, and an active layer 50ac including a silicon layer or the like.

The active layer 50ac has a crystal structure having a (110) plane as the main surface. In a case where the SOI wafer 5w is manufactured by, for example, separation by an implantation of oxygen (SIMOX) method, the substrate 50sb also has (110) crystal. In a case where the substrate 50sb has (110) crystal, there is an advantage that processing such as cleavage is facilitated.

However, the substrate 50sb does not necessarily have a (110) crystal structure. For example, in a case where the SOI wafer is manufactured by a bonding method, the substrate may have a crystal structure other than the (110) crystal.

The line pattern 51 can be obtained by forming lines in the active layer 50ac of the SOI wafer 5w by using the SOI wafer 5w.

As illustrated in FIG. 13B, the line pattern 51 as a first line pattern has a line and space pattern in which a bottom surface 51b reaches the box layer 50bx. The line pattern 51 extends, for example, in a direction substantially perpendicular to a <110> direction that is a crystal orientation of the active layer 50ac.

In wet etching using a KOH solution or the like, the box layer 50bx, such as a silicon oxide layer, is hardly etched relative to the active layer 50ac, such as silicon, and has a high selectivity. When wet etching is continued by using this high selectivity until an inclined surface such as the {111} crystal plane of the foot portion 44 illustrated in FIG. 12 disappears, the line pattern 51 without the inclined surface can be obtained.

It is possible to apply the configurations of the first embodiment and the first and second modifications described above to a sample using such an SOI wafer 5w. In other words, when second and third line patterns extending in a direction intentionally shifted from a direction perpendicular to the <110> direction are formed on the basis of the line pattern 51, a sample corresponding to the above-mentioned sample according to the first embodiment can be obtained. Furthermore, when the second and third line patterns having a side surface roughened by dry etching or the like are formed on the basis of the line pattern 51, a sample corresponding to the above-mentioned sample according to the first modification of the first embodiment can be obtained. Furthermore, when the second and third line patterns to which particles having a known particle size are attached are formed on the basis of the line pattern 51, a sample corresponding to the above-mentioned sample according to the second modification of the first embodiment can be obtained.

Note that the thickness of the active layer can be variously adjusted depending on the conditions for manufacturing the SOI wafer, polishing after manufacturing, or the like. A line pattern may be formed by combined dry etching and wet etching by using an SOI wafer having a thick active layer.

Dry etching is excellent in forming a deep groove with high verticality. However, a complete crystal plane does not appear on the processed surface processed by dry etching. On the other hand, in wet etching using a KOH solution or the like, a processed surface has a substantially complete crystal plane, but the wet etching is isotropic etching and is not suitable for forming a pattern with a small pitch.

Therefore, the dry etching is used for deep etching of the SOI wafer from the thick active layer to a box layer and then the wet etching using a KOH solution or the like is performed, and thus, a processing time of the wet etching can be reduced and the increase of the pitch of the line pattern is prevented. Therefore, the line pattern with a small pitch having a {111} crystal plane on a side surface can be formed.

In a case where the line pattern with a small pitch is formed, a method, such as metal-assisted chemical etching (MacEtch), being excellent in processing a pattern having a higher aspect ratio, may be used.

(First Modification)

Next, a sample 6 according to a first modification of the second embodiment will be described with reference to FIGS. 14 and 15. The sample 6 according to the first modification is different from the sample according to the second embodiment described above in that the sample 6 includes line patterns 61a to 63a and 61f to 63f having different electrical states.

Figure 14:
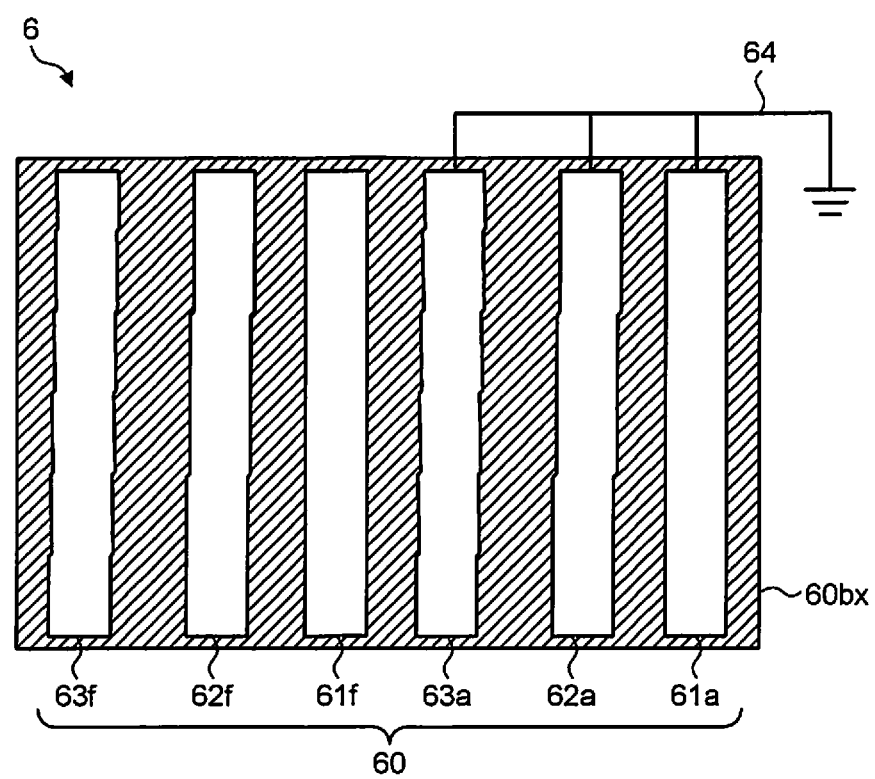
FIG. 14 is a plan view schematically illustrating an exemplary configuration of a sample according to a first modification of the second embodiment.

FIG. 14 is a plan view schematically illustrating an exemplary configuration of the sample 6 according to the first modification of the second embodiment. As illustrated in FIG. 14, the sample 6 according to the first modification also has an SOI wafer and includes a pattern 60 arranged on a box layer 60bx. The pattern 60 includes the line patterns 61a to 63a and 61f to 63f.

The line patterns 61a and 61f as a first line patterns extend in a direction substantially perpendicular to a <110> direction and have an LER that can be regarded as substantially zero and a substantially infinite correlation length $\xi$. An LER having a predetermined correlation length $\xi$ is introduced into the line patterns 62a and 62f as a second line pattern and the line patterns 63a and 63f as a third line pattern by at least any of methods in the first embodiment and the first and second modifications thereof described above.

The line patterns 61f to 63f are arranged on the box layer 60bx as an insulating layer, being in a floating state. The line patterns 61a to 63a are connected to a ground wire 64, being in a grounded state. This configuration enables examination of the influence of charging by an electron beam from a measurement apparatus on a measuring accuracy.

However, the line patterns 61a to 63a may be grounded by a method other than the method described above. For example, the line patterns 61a to 63a can be brought into the grounded state by being brought into physical contact with an SOI wafer substrate. Furthermore, if the line patterns 61a to 63a each have a sufficiently large volume, an electric capacity thereof also increases, and an influence of the charging can be ignored.

Figure 15:
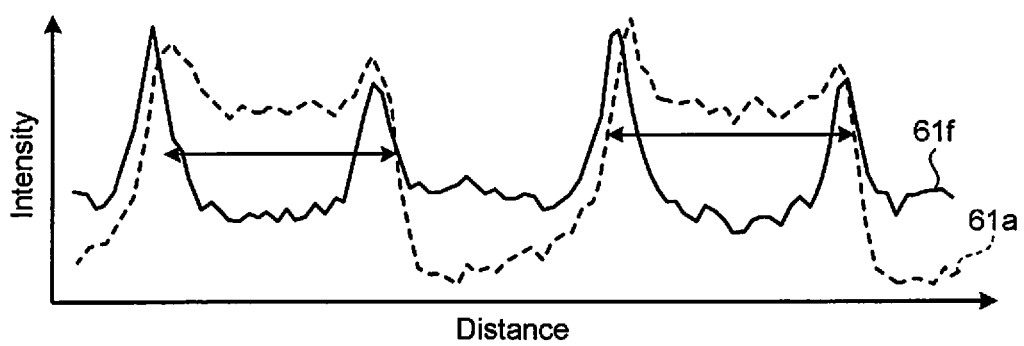
FIG. 15 is a graph illustrating a signal intensity profile of an image obtained from a line pattern according to the first modification of the second embodiment.

FIG. 15 is a graph illustrating signal intensity profiles of images obtained from the line patterns 61a and 61f according to the first modification of the second embodiment. In the graph, the horizontal axis represents measurement position in a cross-section in a direction perpendicular to an extending direction of each of the line patterns 61a and 61f, and the vertical axis represents signal intensity.

As illustrated in FIG. 15, a line width of the line pattern 61f charged in the floating state is measured wider than a line width of the line pattern 61a in the grounded state (reference: Journal of Vacuum Science & Technology B36, 06J502 (2018)). When the line patterns 61a and 61f, which are not charged, are measured, the signal intensity profiles thereof are almost the same, and it is known that the line patterns 61a and 61f have the same line width. Therefore, it can be seen that the difference in signal intensity profile in the graph of FIG. 15 is due to the influence of charging.

The sample 6 according to the first modification of the second embodiment enables to show accuracy and precision in a result of measurement of the pattern under the influence of charging and enables to evaluate a charging countermeasure technique in the measurement apparatus, as well.

(Second Modification)

It is also possible to apply the configurations of the above-described second embodiment and the first modification of the second embodiment to a sample for calibration of a defect inspection apparatus. The defect inspection apparatus as the measurement apparatus is an apparatus configured to detect a defect such as pin dot defect and pin hole defect, for example, by comparing patterns of adjacent dies.

In the defect inspection apparatus, a pattern into which a defect, called a programmed defect, is introduced may be evaluated to determine whether a defect having a predetermined size is correctly detected, where the programmed defect has a pin dot defect, pin hole defect, or the like which is a target to be detected by the defect inspection apparatus and has a size intentionally changed. A result of determination is used for calibration of the defect inspection apparatus.

However, if the pattern used for determination has an LER greater than or equal to a predetermined magnitude, the pattern becomes a factor of disturbance in evaluation in the defect inspection apparatus.

Figure 16:
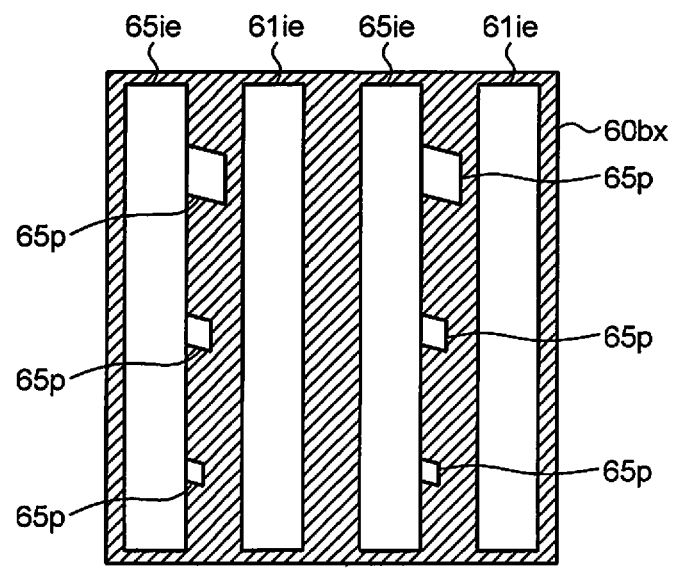
FIG. 16 is a plan view schematically illustrating an exemplary configuration of a line pattern according to a second modification of the second embodiment.

Therefore, as illustrated in FIG. 16, a line pattern 61ie without a programmed defect and a line pattern 65ie into which a programmed defect 65p is introduced are formed on the basis of the line pattern 51 according to the second embodiment, and the evaluation of the defect inspection apparatus can be performed in such a state where the LER being a factor of disturbance is substantially zero. Furthermore, in a case where the programmed defect 65p is introduced, the influence of the LER need not be considered, and the programmed defect 65p can be set to a minute size of, for example, approximately 2 nm or less.

Furthermore, when a line pattern without a programmed defect and a line pattern into which a programmed defect is introduced are formed on the basis of the line patterns 61a and 61f according to the first modification described above, an influence of charging on the defect inspection apparatus can also be examined.

Third Embodiment

Hereinafter, a third embodiment will be described in detail with reference to the drawings. The third embodiment is different from the first and second embodiments described above in a configuration in which a line pattern having a predetermined crystal plane on a side wall is formed by crystal growth.

(Method of Manufacturing Sample)

Figure 17A:
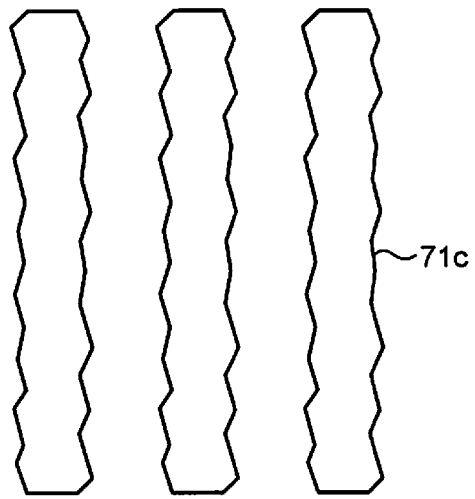
FIGS. 17A and 17B are plan views each illustrating an example of a procedure of a method of forming a line pattern according to a third embodiment.
Figure 17B:
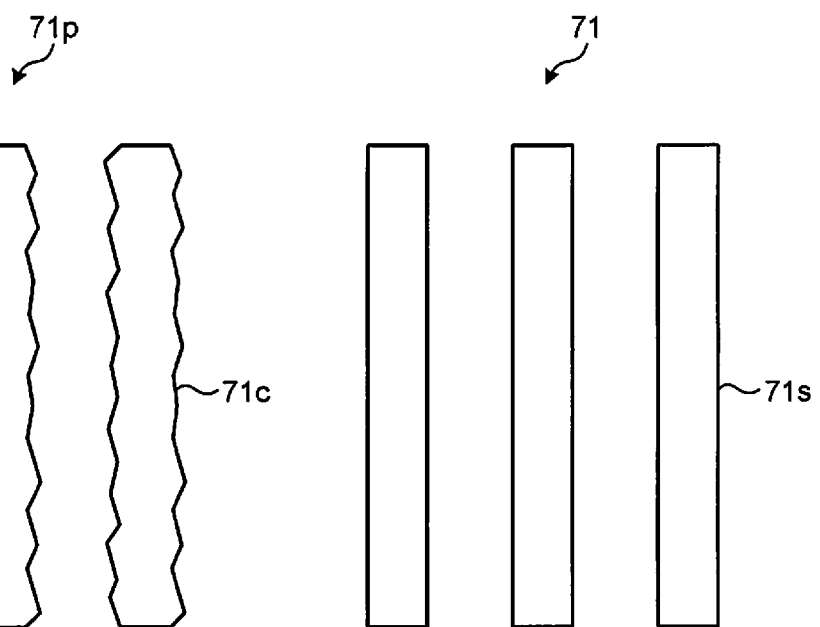

FIGS. 17A and 17B are plane views each illustrating an example of a procedure of a method of forming a line pattern 71 according to a third embodiment.

FIG. 17A illustrates a line pattern 71p formed by a lithography technology such as optical lithography or electron beam lithography and a dry etching technology such as reactive ion etching (RIE). The line pattern 71p extends in a direction substantially perpendicular to a <110> direction.

As illustrated in FIG. 17A, the line pattern 71p formed by lithography and dry etching may have an increased LER caused by irregularities 71c formed on a side surface due to, for example, transfer of an LER of a resist pattern or side wall roughness by dry etching.

Next, a protective layer (not illustrated) including an insulating layer or the like is formed on an upper surface of the line pattern 71p. When forming the line pattern 71p, a hard mask may be formed in advance to assist a resist pattern or the like so that the hard mask may be used as the protective layer.

Next, crystal growth is performed on the line pattern 71p by using a liquid phase growth technique or the like. In the liquid phase growth technique, crystal growth proceeds in a state close to an equilibrium state, and thus, a {111} crystal plane which is the most stable plane is readily formed. The crystal growth is hardly performed on the upper surface of the line pattern 71p due to the presence of the protective layer.

Furthermore, by adjusting a temperature of a solution or melt, both of etching such as dissolution or melting and crystal growth are performed in parallel. Thereby, it is possible to perform the crystal growth mainly on a side surface of the line pattern 71p while suppressing the increase of a line width of the line pattern 71p.

Specifically, firstly, etching is advanced by slightly raising the temperature of the solution or melt relative to the equilibrium temperature thereof. At that time, a portion having a small curvature radius, such as the irregularities 71c on the side surface of the line pattern 71p, is preferentially etched. Then, crystal growth is advanced by lowering the temperature of the solution or melt so that the line width is not reduced too much.

When the side surface of the line pattern 71p is covered substantially completely with the {111} crystal plane, liquid phase growth is finished. Thereafter, the protective layer, which is not illustrated, is removed from the upper surface of the line pattern 71p.

FIG. 17B illustrates the line pattern 71 as a first line pattern obtained as described above. The line pattern 71 includes a side surface 71s having a {111} crystal plane and has an LER that can be regarded as substantially zero and a substantially infinite correlation length $\xi$.

When second and third line patterns into which an LER having a predetermined correlation length $\xi$ is introduced are formed on the basis of the line pattern 71, by at least any of the methods according to the first embodiment and the first and second modifications thereof described above, a sample according to the third embodiment can be obtained.

Note that in processing using the lithography technique and dry etching technique, for example, it is possible to manufacture a fine pattern with a half pitch of 20 nm or less. To manufacture the fine pattern, for example, an electron beam lithography technique or double patterning technique is preferably used. The double patterning technique is a technique using double exposure in which the first resist patterns are exposed and formed and then the second new resist patterns are exposed to be formed between the first resist patterns.

The sample according to the third embodiment enables to show accuracy and precision in a result of measurement, for example, of the line pattern 71 having a fine half pitch of 20 nm or less. By utilizing this for calibration of the measurement apparatus, measurement accuracy in a fine pattern can be improved.

Note that as a material of the sample according to the third embodiment, any of a silicon wafer and an SOI wafer can be used.

(Modification)

As a modification, instead of the liquid phase growth technique in the third embodiment, a vapor phase growth technique, such as a molecular beam epitaxy (MBE) technique or a metal organic chemical vapor deposition (MOCVD) technique, can be used as well.

In the vapor phase growth technique, crystal growth rate is slower than that in the liquid phase growth technique, and the line width is readily controlled. Furthermore, depending on crystal growth conditions, not only {111} crystal plane being the most stable plane but also a metastable plane such as a {110} crystal plane or {100} crystal plane can be formed. A crystal plane obtained also greatly depends on the crystal orientation of a base for crystal growth. With this feature, exposing a (110) plane being an upper surface of a line pattern after dry etching leads to a state in which the (110) plane readily grows on the upper surface and the {111} crystal plane is readily grows on a side surface.

In addition, when using the vapor phase growth technique, it is preferable to reduce the line width of the line pattern after dry etching beforehand. For electron beam lithography or lithography using extreme ultraviolet (EUV), a negative resist is frequently used. In this case, it is easy to make a line width narrower than a space width. Thus, even if the line width is increased due to vapor phase growth, a line pattern having a desired line width can be obtained.

As a material of a sample according to the modification, both of a silicon wafer and an SOI wafer can be used as well.

Fourth Embodiment

Hereinafter, a fourth embodiment will be described in detail with reference to the drawings. The fourth embodiment is different from the first to third embodiments described above in a configuration which has a line pattern made finer.

(Method of Manufacturing Sample)

Figure 18A:
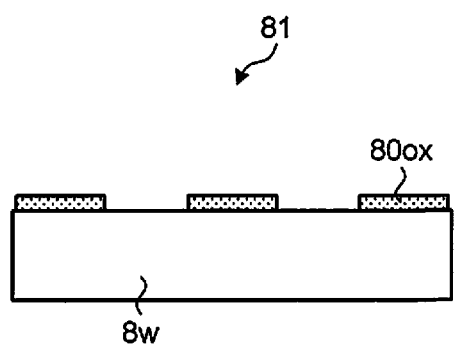
FIGS. 18A and 18B are cross-sectional views illustrating an example of a procedure of a method of forming a line pattern according to a fourth embodiment.
Figure 18B:
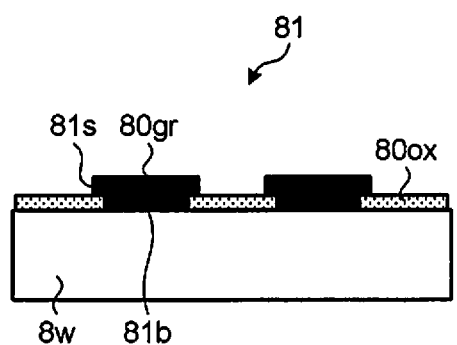

FIGS. 18A and 18B are cross-sectional views illustrating an example of a procedure of a method of forming a line pattern 81 according to the fourth embodiment.

As illustrated in FIG. 18A, for example, a mask pattern 80ox such as a silicon oxide layer is formed on a wafer 8w having a (110) plane as a main surface. The mask pattern 80ox is formed to extend in a direction substantially perpendicular to a <110> direction of the wafer 8w.

For formation of the mask pattern 80ox, for example, a hydrogen silsesquioxane (HSQ) resist that is a negative electron beam resist can be used. The HSQ resist is said to be the most excellent material for fine processability today, having report showing that the HSQ resist has achieved a half pitch of around 10 nm or the HSQ resist has achieved a line width of several nanometers for an isolated pattern.

The HSQ resist is a silicon-based resist and is converted into $SiO_2$ by annealing after patterning. The HSQ resist is patterned by, for example, electron beam lithography. Use of the HSQ resist enables to obtain a fine mask pattern 80ox such as a silicon oxide layer relatively readily.

Next, crystal growth is performed on the wafer 8w on which the mask pattern 80ox is formed by using a liquid phase growth technique or a vapor phase growth technique. Crystal is selectively grown on the (110) plane of the wafer 8w exposed from the mask pattern 80ox. When an upper surface of the crystal exceeds the height of the mask pattern 80ox, the crystal expands also slightly laterally. At this time, the upper surface of the crystal has the (110) plane which is the same as the main surface of the wafer 8w being a base. A side surface of the crystal has a {111} crystal plane being the most stable plane. Note that when the liquid phase growth technique is used, the {111} crystal plane may be formed on the upper surface of the crystal. In such a case, the upper surface of the crystal is flattened by a chemical mechanical polishing (CMP) technique.

FIG. 18B illustrates the line pattern 81 as a first line pattern obtained as described above. The line pattern 81 includes crystal 80 gr obtained by crystal growth, has a side surface 81s having a {111} crystal plane, and has an LER that can be regarded as substantially zero and a substantially infinite correlation length $\xi$.

When second and third line patterns into which an LER having a predetermined correlation length $\xi$ is introduced are formed on the basis of the line pattern 81, by at least any of the methods according to the first embodiment and the first and second modifications thereof described above, and a sample according to the fourth embodiment can be obtained.

In the above description, when forming the second and third line patterns extending in a direction intentionally shifted from a direction perpendicular to the <110> direction on the basis of the line pattern 81, the (110) plane of the main surface of the wafer 8w becomes a seed crystal. Therefore, the side surface of the crystal growing therefrom has the {111} crystal plane, and an atomic step is formed with a crystallographic period.

Note that as a material of the sample according to the fourth embodiment, any of a silicon wafer and an SOI wafer can be used.

Incidentally, as in the third and fourth embodiments described above, it is also possible to introduce a programmed defect into the line patterns 71 and 81 obtained by using crystal growth to make a sample for calibration of the defect inspection apparatus. When the programmed defect is formed, for example, only by etching, a high index plane appears on a side surface of the programmed defect, increasing etching rate, and it is difficult to control the size of the programmed defect. As described above, if the crystal growth is used, it is possible to form a {111} crystal plane on a side surface of a programmed defect, and control of the size of the programmed defect is facilitated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate comprising
first and second line patterns that extend in directions intersecting a <111> direction and have at least one {111} crystal plane on each of side surfaces,
wherein the side surface of the first line pattern has a first roughness, and
the side surface of the second line pattern has a second roughness larger than the first roughness.

2. The substrate according to claim 1, wherein
the first line pattern extends in a first direction closer to a direction perpendicular to a <111> direction relative to the second line pattern, and
the second line pattern extends in a second direction oblique to the extending direction of the first line pattern, the side surface of the second line pattern having an atomic step that appears with a first period.

3. The substrate according to claim 1, wherein
the side surface of the first line pattern has a mirror surface, and
the side surface of the second line pattern has random irregularities.

4. The substrate according to claim 1, wherein
a particle that has a first diameter is attached to the side surface of the second line pattern.

5. The substrate according to claim 1, wherein
the second roughness of the side surface of the second line pattern is obtained by introducing a programmed defect on the side surface of the second line pattern that has the first roughness.

6. The substrate according to claim 1, wherein
the first and second line patterns are arranged at a substrate that has a (110) plane as a main surface, and
an upper surface of each of the first and second line patterns includes the main surface of the substrate.

7. The substrate according to claim 1, wherein
the first and second line patterns are arranged on a substrate that has a (110) plane as a main surface, and
a bottom surface of each of the first and second line patterns is in contact with the main surface of the substrate.

8. The substrate according to claim 7, wherein
an insulating layer that covers part of the substrate is arranged on the substrate, and
the first and second line patterns are arranged on the substrate exposed from the insulating layer.

9. The substrate according to claim 1, wherein
the first and second line patterns are arranged on an insulating layer.

10. The substrate according to claim 9, wherein
part of each of the first and second line patterns is in a floating state, and
other part of each of the first and second line patterns is in a grounded state.

11. A method for calibration of a measurement apparatus comprising:
measuring first and second line patterns of a sample by the measurement apparatus; and
calibrating the measurement apparatus based on a measurement result,
the sample including
the first and second line patterns that extend in directions intersecting a <111> direction and have at least one {111} crystal plane on each of side surfaces,
wherein the side surface of the first line pattern has a first roughness, and
the side surface of the second line pattern has a second roughness larger than the first roughness.

12. The method for calibration of the measurement apparatus according to claim 11, wherein
the first line pattern extends in a first direction closer to a direction perpendicular to a <111> direction relative to the second line pattern, and
the second line pattern extends in a second direction oblique to the extending direction of the first line pattern, the side surface of the second line pattern having an atomic step that appears with a first period.

13. The method for calibration of the measurement apparatus according to claim 11, wherein
the side surface of the first line pattern has a mirror surface, and
the side surface of the second line pattern has random irregularities.

14. The method for calibration of the measurement apparatus according to claim 11, wherein
a particle that has a first diameter is attached to the side surface of the second line pattern.

15. The method for calibration of the measurement apparatus according to claim 11, wherein
the second roughness of the side surface of the second line pattern is obtained by introducing a programmed defect on the side surface of the second line pattern that has the first roughness.

16. The method for calibration of the measurement apparatus according to claim 11, wherein
the first and second line patterns are arranged at a substrate that has a (110) plane as a main surface, and
an upper surface of each of the first and second line patterns includes the main surface of the substrate.

17. The method for calibration of the measurement apparatus according to claim 11, wherein
the first and second line patterns are arranged on a substrate that has a (110) plane as a main surface, and
a bottom surface of each of the first and second line patterns is in contact with the main surface of the substrate.

18. The method for calibration of the measurement apparatus according to claim 17, wherein
an insulating layer that covers part of the substrate is arranged on the substrate, and
the first and second line patterns are arranged on the substrate exposed from the insulating layer.

19. The method for calibration of the measurement apparatus according to claim 11, wherein
the first and second line patterns are arranged on an insulating layer.

20. The method for calibration of the measurement apparatus according to claim 19, wherein
part of each of the first and second line patterns is in a floating state, and
other part of each of the first and second line patterns is in a grounded state.

\* \* \* \* \*